United States Patent [19]
Allen et al.

[11] Patent Number: 5,623,183
[45] Date of Patent: Apr. 22, 1997

[54] DIVERGING BEAM ELECTRON GUN FOR A TOXIC REMEDIATION DEVICE WITH A DOME-SHAPED FOCUSING ELECTRODE

[75] Inventors: Curtis G. Allen, Hayward; Richard B. True, Sunnyvale, both of Calif.

[73] Assignee: Litton Systems, Inc., Woodland Hills, Calif.

[21] Appl. No.: 408,210

[22] Filed: Mar. 22, 1995

[51] Int. Cl.$^6$ .................................................. H01J 37/063
[52] U.S. Cl. ........................ 315/5.37; 315/382; 315/5.34; 250/492.3; 313/447
[58] Field of Search .................... 315/5.33, 5.34, 315/344, 382; 250/492.3; 313/447, 454, 5.37

[56] References Cited

U.S. PATENT DOCUMENTS

| | | | |
|---|---|---|---|
| 3,040,205 | 6/1962 | Walker | 315/382 X |
| 3,500,110 | 3/1970 | Winsor | 313/454 X |
| 3,924,153 | 12/1975 | McIntyre | 315/382 X |
| 4,593,230 | 6/1986 | True | 313/454 X |
| 4,994,709 | 2/1991 | Green et al. | 313/447 X |
| 5,117,153 | 5/1992 | Do | 313/447 |
| 5,319,211 | 6/1994 | Matthews et al. | 250/492.3 |

FOREIGN PATENT DOCUMENTS

221540  1/1990  Japan ..................... 315/5.33

Primary Examiner—Benny Lee
Assistant Examiner—Justin P. Bettendorf
Attorney, Agent, or Firm—Graham & James LLP

[57] ABSTRACT

An electron gun for use in remediation of hazardous volatile organic compounds is provided. The electron gun comprises a cathode having a concave emitting surface and a dome-shaped focusing electrode concentrically surrounding the emitting surface. The focusing electrode has an inwardly protruding lip portion that extends at least partially into a beam focusing region defined in front of the emitting surface. A target grid is spaced from the cathode and a negative voltage is applied between the emitting surface and the target. The target grid has a surface area that is substantially larger than an associated surface area of the emitting surface. An electron beam is provided by the emitting surface in response to the negative voltage, and is focused into a broad diverging beam by the focusing electrode. The electron gun may be configured for temperature limited emission or space charge limited emission.

27 Claims, 5 Drawing Sheets

DIVERGING BEAM ELECTRON GUN FOR A TOXIC REMEDIATION DEVICE WITH A DOME-SHAPED FOCUSING ELECTRODE

RELATED APPLICATION

This invention relates to copending application Ser. No. 08/408,474, filed on the same date herewith, entitled ELECTRON WINDOW FOR TOXIC REMEDIATION DEVICE WITH A SUPPORT GRID HAVING DIVERGING ANGLE GRIDS, owned by the assignee of this application.

BACKGROUND OF THE INVENTION

1. Field of the Invention

The present invention relates to the use of a high energy electron beam to chemically transform or destroy certain types of hazardous waste, and more particularly, to an electron gun that provides a broad diverging electron beam that can be efficiently transmitted into a detoxification vessel.

2. Description of Related Art

Volatile organic compounds (VOCs) exist in the form of vapors or gasses that are emitted or vaporized from hazardous or toxic waste materials. Since these VOCs pose a significant health risk to individuals and to the environment, it is necessary to contain, extract and collect the hazardous materials so as to prevent spreading of the VOCs into the air and/or ground water. Once contained, the VOCs can be remediated by converting them into less hazardous materials that can be disposed of with substantially reduced risk.

One such remediation technique involves the injection of a high energy electron beam into a detoxification vessel containing the VOCs. Interaction between the electrons of the beam and the VOCs causes chemical transformation of the VOCs in three significant aspects, including: (1) direct de-chlorination resulting in inorganic chloride ions and reactive organic intermediates which are further degraded into non-reactive compounds; (2) production of organic and inorganic free radicals and ions which are reactive and whose reactions result in destruction of the target hazardous materials; and (3) formation of aqueous electrons (in the presence of water vapor) capable of reducing chemical bonds. An example of a toxic remediation device comprising an electron beam coupled into a detoxification vessel is disclosed in U.S. Pat. No. 5,319,211.

In order to achieve a sufficient level of remediation within the detoxification vessel, it is desirable to provide a broad electron beam having relatively high energy (in excess of 160 kilovolts DC). The source of the electron beam typically comprises a tungsten filament and a positively biased control grid. The tungsten filament emits a broad, unfocused stream of electrons in response to a positive voltage applied to the control grid. The control grid also focuses the beam into isolated beamlets having non-uniform current density. A set of magnetic coils can be used to move the beam over the surface of a target grid that separates the electron beam source from the detoxification vessel in order to keep the target grid from overheating at any one spot.

A significant drawback of this type of electron beam source is that the filament is operated at a rather high temperature (in excess of 1,700° C.) and filament power level. The control grid must also dissipate a relatively high intercept current which is manifested in the form of excess heat. Unless the high heat level generated by the filament and control grid can be efficiently removed from the device, the operating efficiency, life and reliability of the device is degraded. In some cases, the heat from the filament has been known to cause damage to the high voltage connection to the device. Moreover, the inherent inefficiency associated with using a tungsten filament as an electron source renders it entirely impractical to operate more than one such beam source in parallel due to the extremely high filament power requirement.

An alternative approach is to utilize a conventional electron gun of the type commonly used in linear beam devices, such as klystrons and traveling wave tubes, as the electron beam source. Such electron guns include a thermionic dispenser cathode, and are capable of efficiently producing a high energy electron beam. The shape of this electron beam, however, is not optimum for use in toxic remediation. Instead of producing a broad, diverging electron beam, prior art electron guns produce a converging beam that tends to concentrate all the energy of the beam into a relatively small diameter region of the detoxification vessel. The concentrated beam produces localized hot spots by interception with the target grid and the surfaces of the detoxification vessel. As a result, the interaction between the electrons and the VOCs is less than optimum and a significant portion of the energy of the beam is dissipated in the form of thermal loss. Further, the electron gun must operate at a relatively low beam current in order to keep the current density ($w/cm^2$) measured at the target grid below an acceptable level.

Thus, a critical need exists for an efficient electron beam source to provide a diverging beam that can be introduced into a detoxification vessel with uniform current density over a wide surface. Such an electron beam source would enable higher transmitted energy and better interaction of the electron beam with the VOCs of the detoxification vessel.

SUMMARY OF THE INVENTION

In accordance with the teachings of this invention, an electron gun for use in remediation of hazardous volatile organic compounds is provided. The electron gun produces a diverging electron beam having a uniformly-spaced energy distribution pattern.

The electron gun comprises a cathode having an emitting surface and a dome-shaped focusing electrode that concentrically surrounds the emitting surface. The focusing electrode has an inwardly protruding lip portion that extends at least partially into a beam focusing region defined in front of the emitting surface. A target grid is spaced from the cathode and a positive voltage is applied between the emitting surface and the target grid. The target grid has a surface area that is substantially larger than an associated surface area of the emitting surface. An electron beam is emitted by the emitting surface in response to the applied target grid voltage, and is caused to cross-over and diverge by the focusing electrode to provide a broad diverging beam that impacts the target grid.

More particularly, the lip portion further comprises a rounded inner rim that defines an aperture through which the electron beam is focused. The lip portion extends inwardly in a radial direction substantially perpendicular with a central axis of the emitting surface. A cross-over point of the electron beam is defined along the axis by the lip portion of the focusing electrode. Alternatively, the focusing electrode may operate at a more negative voltage than the emitting surface. When the focusing electrode has the same electrical potential as the cathode (zero bias), or a potential that is negative with respect to the cathode (negative bias), the focusing electrode draws no beam current, and hence dissipates no power from beam interception.

In an embodiment of the electron gun, a control grid is added which is spaced from and disposed substantially parallel to the emitting surface. The control grid has a plurality of holes providing an array of individual diverging electron beams, or beamlets. A voltage is applied to the control grid which is slightly negative with respect to the negative voltage applied to the emitting surface. The control grid does not draw any electrical current from the electron beam due to its slightly negative voltage, and as a result, the grid does not dissipate any energy.

In another embodiment of the electron gun, two concentric focusing cylinders are added to control uniformity of electron emission from the emitting surface as well as uniformity of current density at the target grid. A first cylinder is disposed at the same potential as the cathode. A second cylinder provides an edge current control electrode and is biased positive with respect to the cathode. Both the first and second cylinder are surrounded by the dome-shaped focusing electrode that is biased negative with respect to the cathode.

A more complete understanding of the diverging beam electron gun will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention satisfies the critical need for an efficient electron beam source to provide a diverging beam useful for toxic remediation. The diverging electron beam source produces a uniformly-spaced energy distribution pattern that results in a high rate of transmission of beam energy into a detoxification vessel with a maximum amount of beam current for a given diameter. In the detailed description which follows, like element numerals are used to describe like elements in one or more of the various figures.

Figure 1:
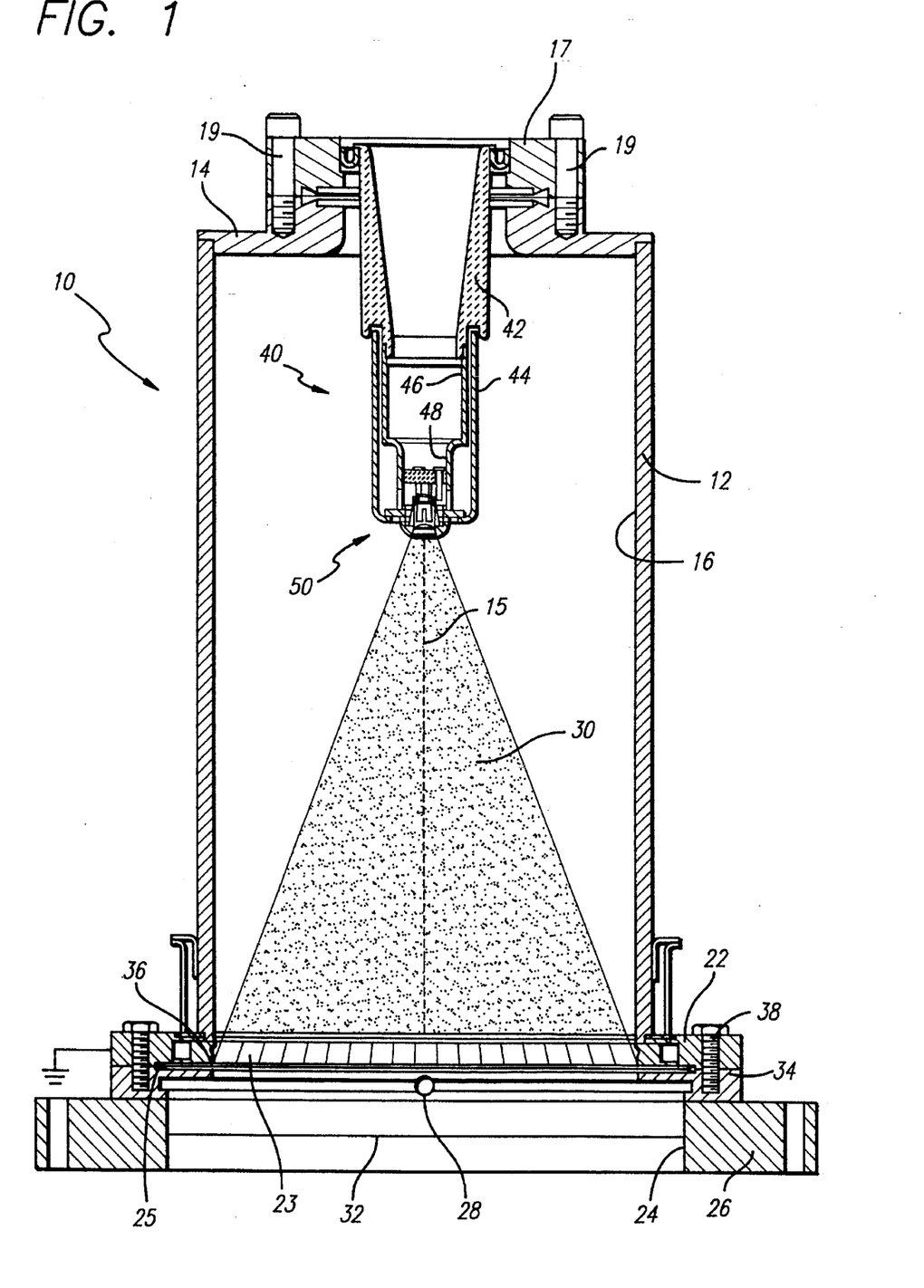
FIG. 1 is a cross-sectional side view of a diverging electron beam source of the present invention.

Referring first to FIG. 1, an evacuated electron beam source 10 of the present invention is illustrated. The beam source 10 is contained within a generally cylindrical-shaped housing 12 that is enclosed at a first end by a plate 14. An interior surface 16 of the housing 12 defines a chamber in which a diverging electron beam 30 is produced. The diverging electron beam 30 comprises a flow of individual electrons, each respectively following a path which diverges from each other due to the optical characteristics of the beam source 10, as will be further described below.

The diverging electron beam 30 is introduced into a detoxification vessel through a target grid 22. The target grid 22 is circular shaped, and may include a plurality of beam transfer holes 23 to permit the individual electrons of the beam 30 to pass through to the detoxification vessel. A vacuum barrier 36 is provided at a downstream surface of the target grid 22 and a support flange 34 is coupled to the target grid 22, such as by bolts 38, with the vacuum barrier 36 held in place between the target grid 22 and the support flange 34. A conventional O-ring type seal 25 may be provided between the vacuum barrier 36 and the target grid 22, or the vacuum barrier may be brazed to the target grid 22 and/or the support flange 34.

The target grid 22 and vacuum barrier 36 operate together to provide a structural, thermal and vacuum interface between the electron beam source 10 and the detoxification vessel. The vacuum barrier 36 must be capable of maintaining the vacuum within the electron beam source 10, while allowing a sufficient portion of the electrons of the beam 30 to pass therethrough. Further, the vacuum barrier 36 must be able to conduct thermal energy to the structure of the target grid 22, which acts as a heat sink to channel thermal energy out of the system, such as to an external coolant reservoir. The target grid 22 provides structural strength to the relatively weak vacuum barrier in order to withstand the vacuum pressure within the electron beam source 10. The vacuum barrier 36 may be comprised of a metal foil, such as titanium or beryllium, of a thickness selected to provide sufficient strength with minimal energy loss from the electrons of the beam 30.

A portion of the detoxification vessel 24 is illustrated in FIG. 1, and is surrounded by an outer flange 26. The flange 26 permits mechanical coupling between the target grid 22 of the electron beam source 10 and the detoxification vessel. The detoxification vessel has an open chamber (not shown) below the outer flange 26 into which the VOCs are introduced, and the electrons of the beam 30 interact with the VOCs within the chamber. The detoxification vessel may further include a secondary window 32 disposed downstream of the target grid 22 within the outer flange 26. The secondary window 32 provides a secondary barrier to further protect the materials of the target grid 22 and vacuum barrier 36 from possible corrosive effects of the VOCs within the detoxification vessel. An air inlet line 28 may also be provided to introduce cooled or ambient air into the region defined between the target grid 22 and the secondary barrier of the secondary window 32. The air interacts with the electrons of the diverging electron beam to form ozone, which may further be utilized in the detoxification process. Alternatively, the inlet line 28 may be used to introduce other gases into the region between the target grid 22 and the secondary barrier, such as nitrogen or helium, which may also contribute to the detoxification process.

The diverging electron beam 30 is provided by an electron gun structure 40 having a support insulator 42 that extends perpendicularly through an aperture defined in the plate 14 along a central axis of the electron beam source 10. An end block 17 may be coupled to the plate 14 by bolts 19 in order to provide a structural base for the support insulator 42. It is anticipated that the support insulator 42 be comprised of a structurally rigid, thermally conductive and electrically insulative material, such as ceramic.

A cathode support sleeve 46 extends axially from the support insulator 42, and has a generally cylindrical shape. The cathode support sleeve 46 tapers to a narrower diameter cylindrically shaped sleeve 48 that is electrically and structurally coupled to an electron emitting cathode 50, which will be further described below. A corona sleeve 44 having a generally cylindrical shape is concentrically disposed about the cathode support sleeves 46, 48, and may be electrically insulated from the cathode support sleeves. It is anticipated that the cathode support sleeves 46, 48 and the corona sleeve 44 be comprised of an electrically and thermally conductive material, such as copper, molybdenum, or stainless steel.

Figure 2:
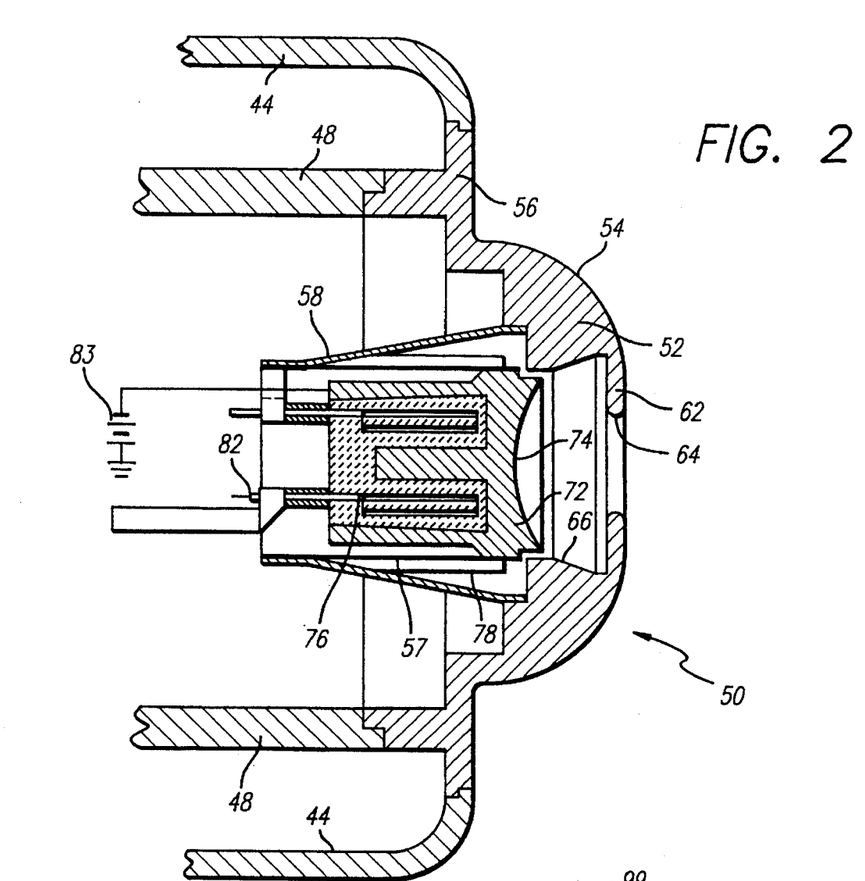
FIG. 2 is a cross-sectional side view of a cathode assembly of the diverging electron beam source having a dome-shaped focusing electrode.

Referring now to FIG. 2, the electron emitting cathode 50 is illustrated in greater detail. The cathode 50 comprises a centrally disposed emitter element 72 having an emitting surface 74. As illustrated in FIG. 2, the emitting surface 74 has a concave shape. Alternatively, however, the emitting surface 74 may have a flat shape. A heating element 76 comprising a heating coil potted within an alumina ceramic substructure is embedded within the emitter element 72. An electrical lead 82 permits the coupling of the heating element 76 to an external voltage source. As known in the art, an electrical current applied to the heating element 76 via the electrical lead 82 raises the temperature of the emitter element 72 until thermionic emission of electrons from the emitting surface 74 occurs. The emitting surface 74 may be comprised of an electron emissive material, or may include an electron emissive coating.

The emitter element 72 is contained within an outer retaining sleeve 58 and an inner retaining sleeve 57 that maintain the emitter element in a proper orientation. The outer retaining sleeve 58 has a cylindrical portion at a first end and a flared or conical portion at a second end adjacent to the emitting surface 74 where it couples to a rear surface of a focusing electrode 52 (described below). The inner retaining sleeve 57 is cylindrical in shape and extends between the cylindrical portion of the outer retaining sleeve 58 and the emitter element 72. A thermal shield 78 extends tangentially from an inner surface of the conical portion of the outer retaining sleeve 58 and is concentric with the inner retaining sleeve 57. The inner and outer retaining sleeves 57, 58 may be comprised of a structurally rigid, thermally resistive material, such as kovar or rhenium.

The focusing electrode 52 comprises a dome-shaped outer surface 54 and a washer-shaped outer rim 56. The outer rim 56 permits electrical and structural coupling to the corona sleeve 44. The dome-shaped outer surface 54 has an inwardly directed lip portion 62 that blocks an outer radial portion of the emitting surface 74. The lip portion 62 lies substantially perpendicular to a central axis of the cathode 50. The lip portion 62 has a rounded edge 64, and an aperture is defined in the space encompassed by the rounded edge. An outwardly flared surface 66 is provided at an interior portion of the focusing electrode 52 that has a general curvature that continues the curvature defined by the concave shape of the emitting surface 74. The curvature of the interior portion of the focusing electrode 52 shapes the electric field lines to achieve uniform electron emission over the entire surface area of the emitting surface 74. A circumferential gap is defined between an outermost edge of the emitting surface 74 and the flared surface 66 of the focusing electrode 52. The focusing electrode 52 does not carry a significant amount of structural stress, but is subjected to some radiated heat. Thus, the focusing electrode 52 is comprised of an electrically and thermally conductive material, such as molybdenum or stainless steel.

Returning now to FIG. 1, the electron beam 30 produced by the electron beam source 10 is controlled and focused by an electric field defined within the source chamber by a voltage applied to the cathode 50. The target grid 22 is coupled to ground, and the absolute voltage applied to the cathode 50 is thus referenced accordingly. The electric field within the beam source 10 is illustrated in terms of voltage equipotential lines. As known in the art, electrons of an electron beam tend to travel in a direction normal to the equipotential lines, and beam shaping or manipulation is achieved by controlling the shape of the equipotential lines. As will be further described below, the shape of the equipotential lines results from the unique shape of the focusing electrode 52.

Figure 4:
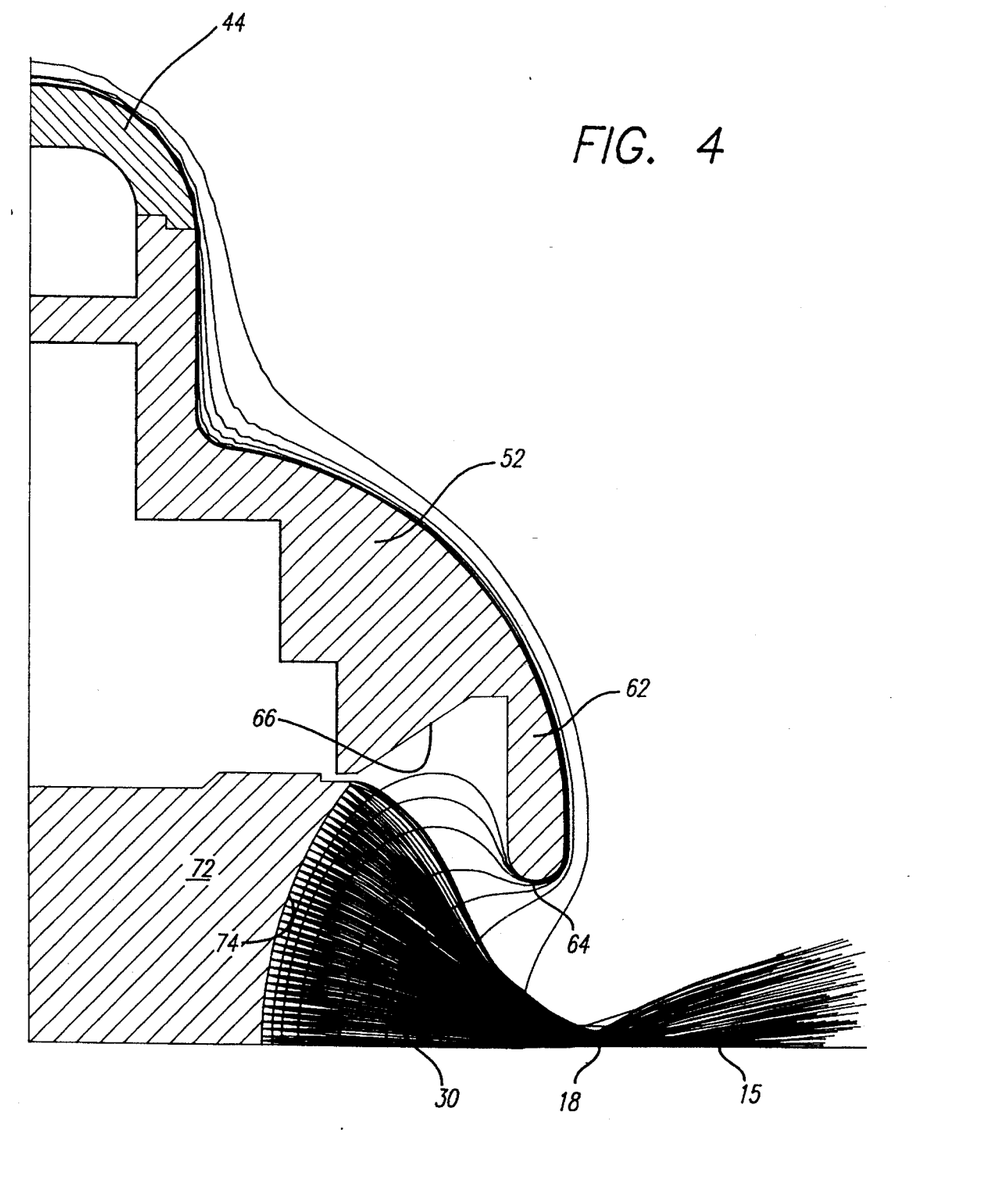
FIG. 4 is a cross-sectional side view of the cathode of the present invention, illustrating an electron beam divergence pattern.

The application of a highly negative potential to the cathode 50 from a voltage source 83 (shown in FIG. 2), such as approximately −160 kilovolts DC, causes electrons that have been thermionically ejected from the emitting surface 74 to be emitted into a beam that is accelerated toward the target grid 22. As can be appreciated from FIG. 1, the target grid 22 has a surface area that is substantially larger than an associated surface area of the emitting surface 74. The focusing electrode 52 is at the same highly negative potential as the cathode 50, so the equipotential lines spaced from the emitting surface 74 bend sharply and wrap around the rounded edge 66 of the lip portion 62, as illustrated in FIG. 4. This particular equipotential shape causes the electrons emitted from the emitting surface 74 to converge toward a cross-over point 18 that is disposed along a central axis 15 of the cathode 50. The cross-over point 18 occurs roughly adjacent to the lip portion 62 and slightly outward from the lip portion along the axis. Downstream of the cross-over point 18, the electron beam 30 diverges sharply, providing an evenly distributed diverging beam.

In FIG. 2, the emitter element 72 of the cathode 50 is mechanically attached to the focusing electrode 52, in which case the emitter element and the focusing electrode will both be at the same electrical potential. The level of current emitted from the emitting surface 74 is thus controlled by the temperature of the emitter element 72. This type of electron emission is commonly referred to as "temperature limited" emission.

Alternatively, the focusing electrode 52 can be electrically isolated from the emitter element 72 by shortening the outer retaining sleeve 58 so that it is detached from the focusing electrode 52. The outer retaining sleeve 58 could then be affixed to an additional support cylinder of smaller diameter than the cathode support sleeve 48. The additional support cylinder would then be mounted on an insulative ceramic element which electrically isolates it from the cathode support sleeves 44, 48 and the focusing electrode 52. The focusing electrode 52 could then be operated at a potential that is different from that of the emitter element 72. In that case, the focusing electrode 52 could be operated at a potential that is a few tens or hundreds of volts negative with respect to the emitter element 72 to suppress all current emitted from the cathode 50, which enables grid or focusing electrode pulsing.

By adjusting the potential of the focussing electrode 52 to be increasingly negative from the zero bias point (potential equal to that of the emitter element 72), it is possible to reduce the level of beam current emitted from the cathode. Also, the size of the beam on target may also change in response to the reduction in voltage. Independent control of beam size and current (where the current change may be accomplished by varying the focussing electrode voltage or cathode temperature in the case of temperature limited emission) leads to a toxic remediation device capable of operating over a generally wider parameter space in comparison to an electron gun having a focussing electrode mechanically connected to the cathode.

In contrast, prior art electron beams known to the microwave tube art are typically drawn evenly from the cathode to provide a cylindrical-shaped laminar beam in which electron trajectories do not cross one another. There may eventually be divergence of the electron beam due to space charge effects, unless a focusing magnetic field is used to compress the beam. Further, the prior art cathodes are invariably space charge limited since the level of beam current is set by the geometry and operating voltage of the cathode, as opposed to the temperature of the cathode. This type of electron emission is commonly referred to as "space charge limited" emission. As known in the art, the temperature of the cathode in space charge limited operation is considerably hotter than that typical of temperature limited emission.

Figure 3:
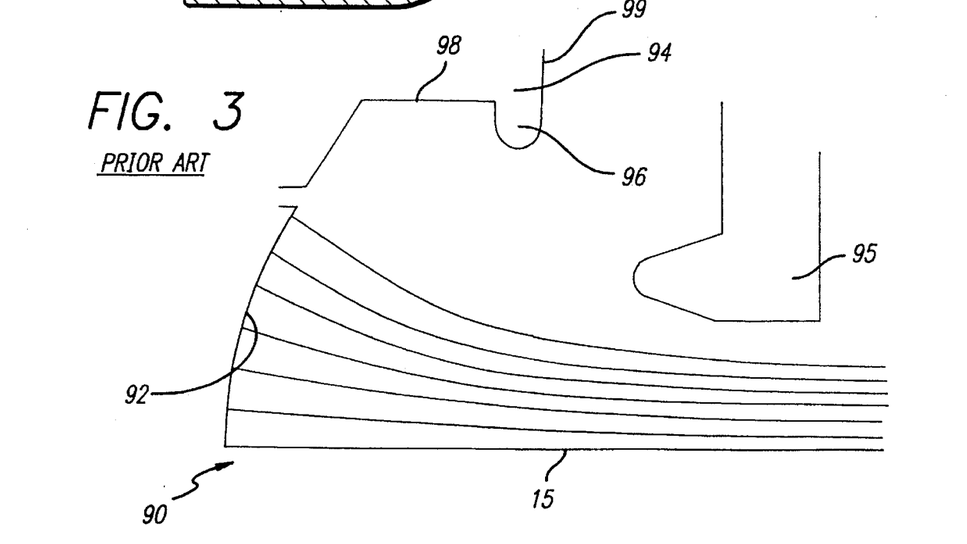
FIG. 3 is a cross-sectional side view of a prior art Pierce electron gun.

FIG. 3 illustrates such a prior art electron beam provided by a beam source 90. The beam source 90 has a concave emitting surface 92 and a focusing electrode 94 disposed concentrically around the emitting surface. The focusing electrode 94 may have a lip portion 96 that extends radially inward toward the central axis 15 of the beam source 90, and an inner surface 98 of the focusing electrode 94 is defined, which lies a sufficient distance from the emitting surface 92. Unlike the present invention, the focusing electrode 94 does not block the emitting surface 92. An outer surface 99 of the focusing electrode 94 lies perpendicular to the beam axis 15 and shapes the equipotential lines in a manner that helps compress the beam. Since space charge effects tend to prevent convergence of the beam, as a result, a substantially parallel electron flow is provided. As discussed above, a beam having parallel electron flow is undesirable in this application. Also, the prior art beam source 90 has a specially shaped anode structure 95 disposed near the emitting surface 92 and focusing electrode 94, which has an aperture for passage of the beam. The electron beam source of the present invention employs a relatively remote target grid 22 as the accelerating electrode or anode.

The electron beam source 10 of the present invention is also far more efficient than the tungsten filament and positively biased grid of the prior art toxic remediation devices. The emitting surface 74 produces a much higher rate of electron emission than the tungsten filament for a given temperature; the typical operating temperature for the emitting surface is in a range from 900° to 1,200° C. In addition, the beam source 10 does not require a positively biased grid which dissipates power. As a result, the beam source of the present invention runs substantially cooler and more reliably than prior art toxic remediation device electron beam sources.

Figure 5:
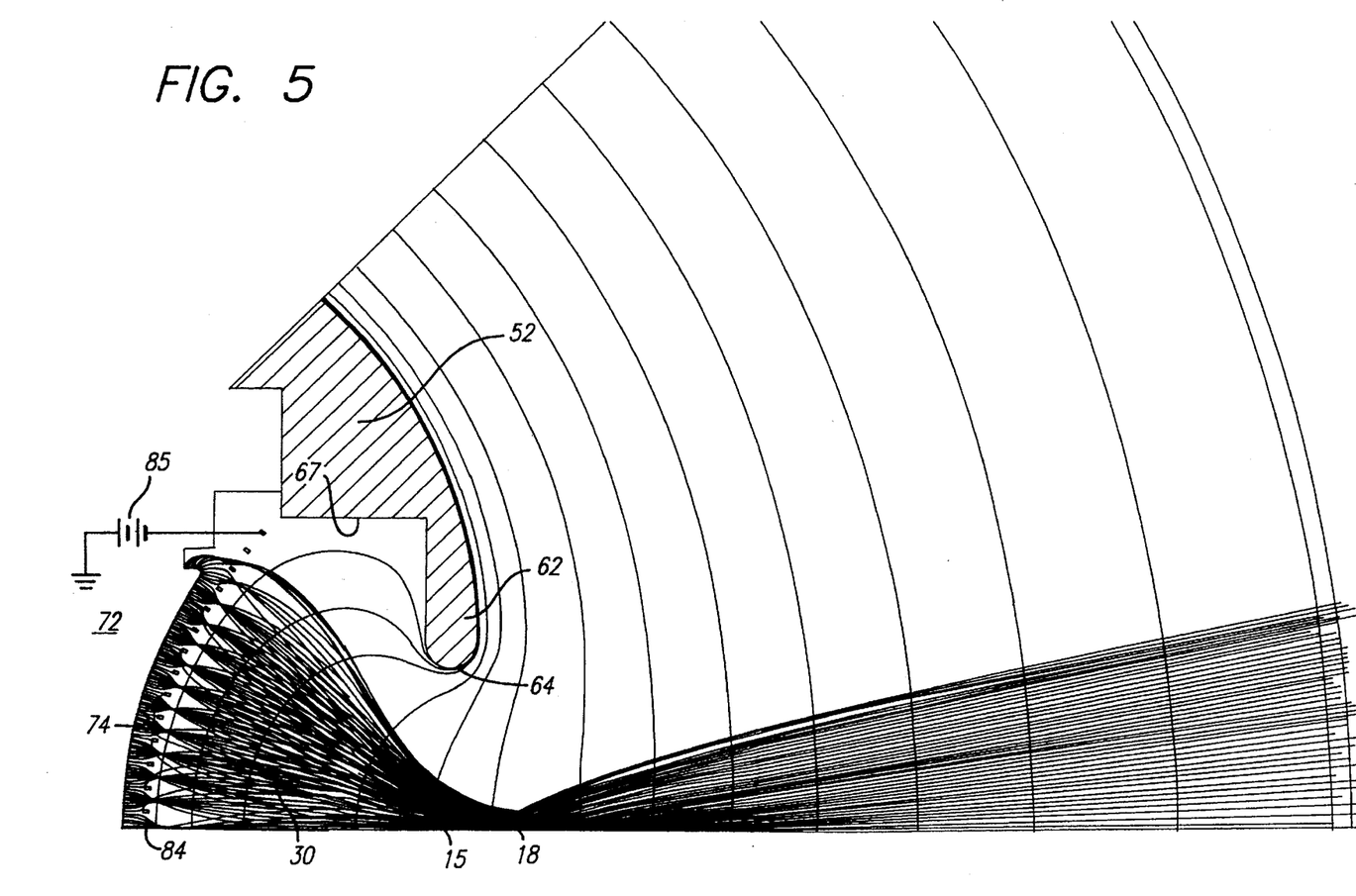
FIG. 5 is a cross-sectional side view of an alternative cathode, illustrating an electron beam divergence pattern through a negatively biased control grid.

An alternative embodiment of the electron beam source is illustrated in FIG. 5. A control grid 84 is closely spaced from the emitting surface 74 within the focusing region defined by the lip portion 62 of the focusing electrode 52. The control grid 84 is comprised of a screen or mesh-like material having a plurality of evenly spaced holes. A negative potential is applied from voltage source 85 to the control grid 84 with respect to the emitting surface 74, causing the uniformly-distributed beam emitted from the emitting surface to become drawn into a plurality of individual beamlets. The plurality of individual beamlets that define the electron beam 30 converge rapidly as they approach the cross-over point 18, then diverge into a broad-shaped beam, as in the embodiment of FIG. 4.

The control grid 84 draws no current from the emitting surface due to its negative potential, and as a result, the control grid dissipates no power. The control grid 84 reduces the field gradient level at the emitting surface 74 so as to allow adjustment of the level of emitted current and the formation of discrete beamlets at the target grid 22. With this arrangement, it is possible to improve the transfer rate of the electron beam energy into the detoxification vessel, by provided a grid pattern at the target grid 22 that matches the pattern of the beamlets.

Figure 6:
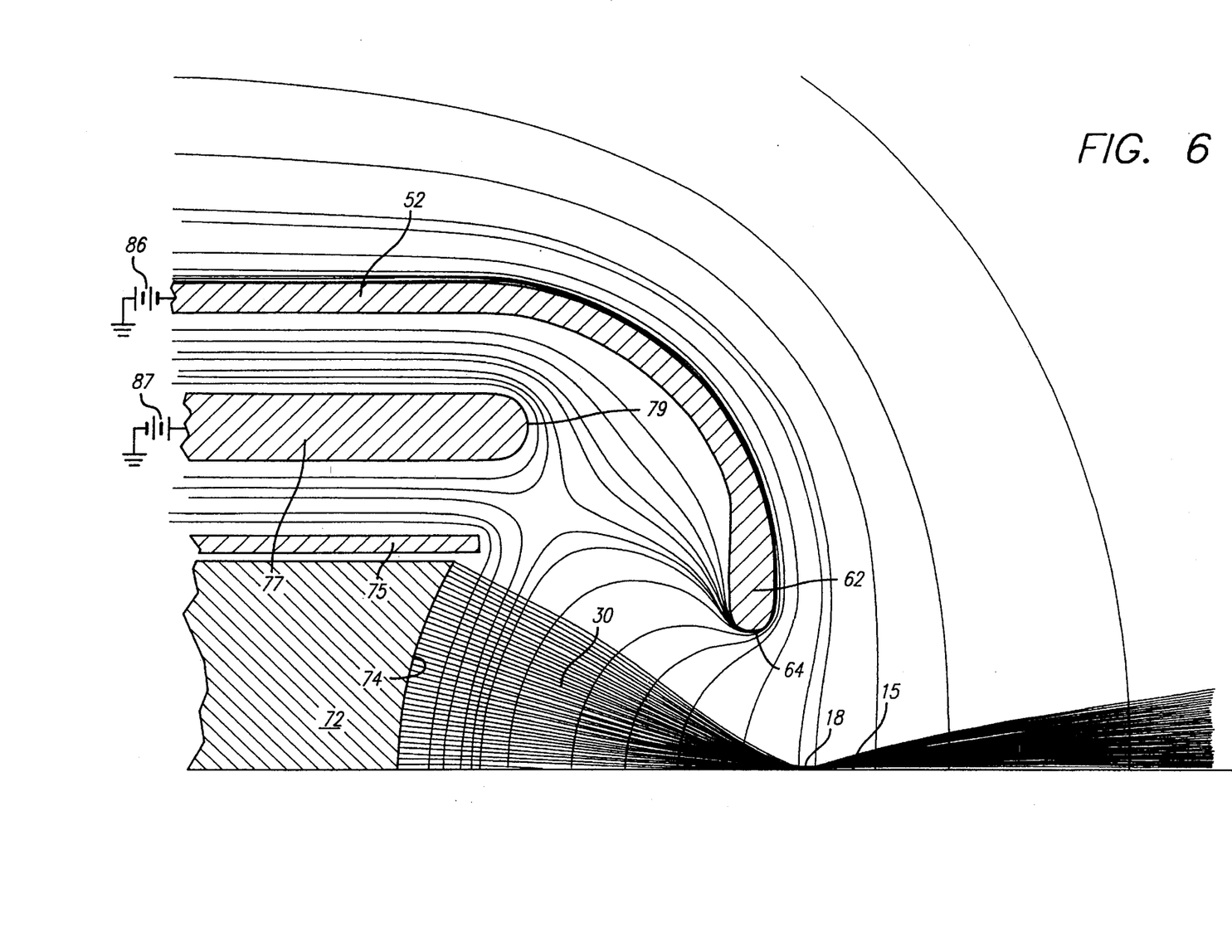
FIG. 6 is a cross-sectional side view of another alternative cathode, illustrating an electron beam divergence pattern focused by a pair of concentric focusing cylinders in addition to the dome-shaped focusing electrode.

Another alternative embodiment of the present invention is illustrated in FIG. 6. In this embodiment, the emitter element 72 is operated space charge limited as opposed to temperature limited (as in the embodiments of FIGS. 4 and 5). Space charge limited operation effectively smooths out the patches of high and low emission associated with temperature limited operation (noting that such patchiness becomes more severe for incompletely activated or temporarily arc poisoned cathodes). Current density on target will have a higher degree of uniformity in the case of space charge limited emission and an absence of beam hot spots on target. This, in turn, will result in more reliable target grid and vacuum barrier foil performance and longer overall device life.

In FIG. 6, two cylindrical electrode elements are utilized in addition to the dome-shaped focusing electrode 52. A first cylindrical element comprises a side focusing electrode 75 that surrounds the entire emitter element 72, and extends in a rearward direction from the approximate vicinity of the circumference of the emitting surface 74. A second cylindrical element comprises an edge current control electrode 77 having a rounded edge 79, and is spaced from and concentric with the side focusing electrode 75. The side focusing electrode 75 is mechanically and electrically coupled to the emitter element 72, while the edge control electrode 77 is electrically isolated from the emitter element. Both the side focusing electrode 75 and the edge current control electrode 77 are comprised of an electrically conductive material, such as molybdenum. The dome-shaped electrode 52 has an inwardly directed lip portion 62 with a rounded edge 64 as in the previous embodiments, but the electrode has a cylindrical shape that is concentric with the edge current control electrode 77 and the side focusing electrode 75, and which extends rearward coaxially with the edge current control electrode and the side focusing electrode. Interelectrode spaces are defined between the dome-shaped electrode 52, the edge current control electrode 77, and the side focusing electrode 75, which contribute to the shape of the equipotential lines.

Voltages of the edge current control electrode 77 and dome-shaped electrode 52 can be independently adjusted, through a voltage source 87 and a voltage source 86, respectively, until a desired level of emitted current is obtained and the current density is uniform along the emitting surface 74 as well as at the target grid 22. The edge current control electrode 77 is biased positive with respect to the emitting element 72, and the dome-shaped control electrode 52 is biased negative with respect to the emitting element 72. The side focusing electrode 75 is at the same potential as the emitting element 72 and is used to prevent electron emission from the side of the cathode. In one possible embodiment, the present invention of FIG. 6 has +150 volts applied to the edge current control electrode 77, −75 volts applied to the dome-shaped control electrode 52, and +160 kilovolts applied to the target grid 22, which produces a 0.0457 ampere electron beam (with all voltages relative to cathode voltage).

It can be seen in FIG. 6 that the amount of electron beam cross-over is very sharp and that the electron trajectories emerge from the cross-over point 18 with a small degree of spherical aberration. Scaled embodiments of this basic configuration in combination with electrostatic and/or magnetic lens elements might be advantageous in applications which employ standard cross-over type guns, such as electron beam based display and imaging devices.

Having thus described a preferred embodiment of a diverging beam electron gun for a toxic remediation device, it should be apparent to those skilled in the art that certain advantages of the within system have been achieved. It should also be appreciated that various modifications, adaptations, and alternative embodiments thereof may be made within the scope and spirit of the present invention, which is defined by the following claims.

What is claimed is:

1. A diverging electron beam source, comprising:

an electron emitter having an emitting surface;

a focusing electrode concentrically surrounding said emitting surface and having a convex, dome-shaped outer surface with an inwardly protruding lip portion that extends at least partially into a beam focusing region defined in front of said emitting surface; and a target spaced from said emitter and means for applying a negative voltage between said emitting surface and said target;

wherein, an electron beam provided by said emitting surface in response to said negative voltage is crossed-over by said focusing electrode to provide a broad diverging beam impacting uniformly on said target.

2. The electron beam source of claim 1, further comprising a control grid spaced from and disposed substantially parallel to said emitting surface, said control grid having a plurality of holes disposed in a first pattern providing an array of individual diverging electron beams.

3. The electron beam source of claim 2, further comprising means for applying a voltage to said control grid, said voltage applied to said control grid being slightly negative with respect to said negative voltage applied to said emitting surface.

4. The electron beam source of claim 1, wherein said lip portion extends inwardly in a radial direction substantially perpendicular with a central axis of said emitting surface.

5. The electron beam source of claim 4, wherein a cross-over point of said electron beam is defined along said axis between said lip portion and said target.

6. The electron beam source of claim 1, wherein said emitter further comprises a thermionic dispenser cathode.

7. The electron beam source of claim 1, wherein said negative voltage is applied to said focusing electrode.

8. The electron beam source of claim 1, wherein said lip portion further comprises a rounded inner rim that defines an aperture through which said electron beam is focused.

9. The electron beam source of claim 1, further comprising a support sleeve coupling said emitter to said focusing electrode.

10. The electron beam source of claim 1, wherein said emitting surface further comprises a concave shape.

11. The electron beam source of claim 1, wherein said focusing electrode is comprised of molybdenum.

12. The electron beam source of claim 1, wherein said focusing electrode is comprised of stainless steel.

13. The electron beam source of claim 1, wherein said target having a surface area that is substantially larger than an associated surface area of said emitting surface.

14. An electron gun, comprising:

a cathode having an emitting surface;

a focusing electrode having a convex, dome-shaped outer surface with an inwardly protruding lip portion that extends at least partially into a beam focusing region defined in front of said emitting surface; and a target spaced from said emitter and means for applying a negative voltage between said emitting surface and said target, said emitting surface providing an electron beam in response to said negative voltage that is crossed-over by said focusing electrode to provide a broad diverging beam impacting uniformly on said target.

15. The electron gun of claim 14, further comprising a control grid spaced from and disposed substantially parallel to said emitting surface, said control grid providing an array of individual diverging electron beams.

16. The electron gun of claim 15, further comprising means for applying a voltage to said control grid, said voltage applied to said control grid being slightly negative with respect to said negative voltage applied to said emitting surface.

17. The electron gun of claim 14, further comprising means for applying said negative voltage to said focusing electrode.

18. The electron gun of claim 14, wherein said lip portion further comprises a rounded inner rim that defines an aperture through which said electron beam passes.

19. The electron gun of claim 14, wherein said lip portion extends inwardly in a radial direction substantially perpendicular with a central axis of said emitting surface.

20. The electron gun of claim 19, wherein a cross-over point of said electron beam is defined along said axis between said lip portion and said target.

21. An electron gun, comprising:

a cathode having an emitting surface;

a focusing electrode having a convex, dome-shaped outer surface with a protruding lip portion that extends inwardly in a radial direction substantially perpendicular with a central axis of said emitting surface at least partially into a beam focusing region defined in front of said emitting surface; and a target spaced from said emitter having a surface area that is substantially larger than an associated surface area of said emitting surface, said emitting surface providing an electron beam that is focused by said focusing electrode to provide a broad diverging beam impacting uniformly on said target;

wherein a cross-over point of said electron beam is defined along said axis between said lip portion and said target.

22. The electron gun of claim 21, wherein said lip portion further comprises a rounded inner rim that defines an aperture through which said electron beam passes.

23. The electron gun of claim 21, further comprising a control grid spaced from and disposed substantially parallel to said emitting surface, said control grid providing an array of individual diverging electron beams.

24. An electron gun, comprising:

a cathode having an emitting surface;

a first cylindrical electrode coupled to and coaxial with said cathode;

a second cylindrical electrode coaxial with said first electrode and electrically isolated from said first electrode;

a focusing electrode having a convex, dome-shaped outer surface with a protruding lip portion that extends inwardly in a radial direction substantially perpendicular with a central axis of said emitting surface at least partially into a beam focusing region defined in front of said emitting surface, and a cylindrical portion coaxial with said second electrode, said dome-shaped focusing electrode being electrically isolated from said first and second electrodes.

25. The electron gun of claim 24, wherein said lip portion further comprises a rounded inner rim that defines an aperture for passage of an electron beam therethrough.

26. The electron gun of claim 24, further comprising means for applying a voltage to said second electrode, said voltage applied to said second electrode being positive with respect to said emitting surface.

27. The electron gun of claim 24, further comprising means for applying a voltage to said dome-shaped focusing electrode, said voltage applied to said dome-shaped focusing electrode being negative with respect to said emitting surface.

* * * * *